United States Patent
Chen et al.

(10) Patent No.: US 10,897,112 B1
(45) Date of Patent: Jan. 19, 2021

(54) AC POWER CORD ASSEMBLY CAPABLE OF EMITTING VISIBLE LIGHTS

(71) Applicant: BKS TEC CORP., Hsinchu (TW)

(72) Inventors: Cheng Hsiang Chen, Hsinchu County (TW); Shang Yu Liu, Hsinchu County (TW)

(73) Assignee: BKS TEC CORP., Hsinchu (TW)

( * ) Notice: Subject to any disclaimer, the term of this patent is extended or adjusted under 35 U.S.C. 154(b) by 0 days.

(21) Appl. No.: 16/583,255

(22) Filed: Sep. 26, 2019

(51) Int. Cl.
| | |
|---|---|
| *H01R 31/06* | (2006.01) |
| *H04B 10/116* | (2013.01) |
| *H01R 9/24* | (2006.01) |
| *H01R 24/60* | (2011.01) |
| *H01R 4/64* | (2006.01) |
| *H01R 13/70* | (2006.01) |
| *H02M 7/02* | (2006.01) |
| *H05K 5/02* | (2006.01) |
| *H01R 24/28* | (2011.01) |
| *H02J 7/00* | (2006.01) |
| *H05B 45/20* | (2020.01) |

(52) U.S. Cl.
CPC ............. *H01R 31/065* (2013.01); *H01R 4/64* (2013.01); *H01R 9/2491* (2013.01); *H01R 13/70* (2013.01); *H01R 24/28* (2013.01); *H01R 24/60* (2013.01); *H02J 7/00* (2013.01); *H02M 7/02* (2013.01); *H04B 10/116* (2013.01); *H05B 45/20* (2020.01); *H05K 5/0278* (2013.01)

(58) Field of Classification Search
CPC ........ H01R 13/70; H01R 24/28; H01R 27/02; H01R 31/065; H01R 4/64; H01R 9/2491; H05B 45/20
See application file for complete search history.

(56) References Cited

U.S. PATENT DOCUMENTS

| | | | | |
|---|---|---|---|---|
| 5,426,347 | A * | 6/1995 | Nilssen | H02M 7/53832 307/150 |
| 8,727,804 | B2 * | 5/2014 | McNeely | A61B 5/0006 439/505 |
| 10,069,252 | B1 * | 9/2018 | Lin | G02B 6/0005 |
| 10,153,599 | B1 * | 12/2018 | Lin | H01R 13/7175 |
| 2005/0124209 | A1 * | 6/2005 | Currie | H01R 13/7172 439/490 |
| 2005/0215108 | A1 * | 9/2005 | Chen | H01R 13/717 439/409 |
| 2012/0028488 | A1 * | 2/2012 | Puschnigg | G06F 1/266 439/189 |
| 2012/0139348 | A1 * | 6/2012 | DuBose | H02J 9/005 307/80 |
| 2015/0340826 | A1 * | 11/2015 | Chien | H01R 27/02 439/490 |
| 2016/0226279 | A1 * | 8/2016 | Anderson | H02J 7/0045 |
| 2017/0162929 | A1 * | 6/2017 | Goren | H01Q 1/46 |
| 2018/0132320 | A1 * | 5/2018 | Fredricks | H05B 47/19 |
| 2018/0212386 | A1 * | 7/2018 | Nauertz | A45C 3/00 |
| 2019/0103714 | A1 * | 4/2019 | Spina | H01R 13/6666 |
| 2019/0305492 | A1 * | 10/2019 | Post | H01R 13/72 |

* cited by examiner

*Primary Examiner* — Oscar C Jimenez
(74) *Attorney, Agent, or Firm* — Min-Lee Teng; Litron Patent & Trademark Office

(57) ABSTRACT

An AC power cord assembly comprises a cable and a control device, wherein the cable includes at least one first wire for transmitting AC voltages and at least one second wire for transmitting visible lights, wherein the control device includes at least one first LED for emitting visible lights to the at least one second wire.

14 Claims, 6 Drawing Sheets

104

AC POWER CORD ASSEMBLY CAPABLE OF EMITTING VISIBLE LIGHTS

BACKGROUND OF THE INVENTION

I. Field of the Invention

The present invention relates to an AC power cord, and in particular, to an AC power cord assembly capable of emitting visible lights.

II. Description of the Prior Art

An AC power cord is utilized to connect AC voltage, such as 110V or 220V, to a device. However, it is difficult to trace an AC power cord when many AC power cords are used to connect remote devices to local devices in the same room. Furthermore, conventional AC power cords do not have the capability of measuring the power of the AC, when the AC power cord is operational.

Accordingly, the present invention proposes a better way to design an AC power cord to overcome the above-mentioned problems.

SUMMARY OF THE INVENTION

One objective of the present invention is to provide an AC (alternating current) power cord assembly for transmitting AC voltages such as 110V or 220V or 380V, as well as for generating a visible light so that a user can use the visible light for different purposes, such as tracing and identifying an AC power cord.

One objective of the present invention is to provide a power cord assembly having the capability of measuring the power of the AC, when the AC power cord is operational.

One objective of the present invention is to provide a power cord assembly having the capability of preventing the AC current from flowing to the external device when the AC current exceeds a threshold.

One embodiment of the present invention is to provide an AC power cord assembly, wherein the power cord assembly comprises a power cord, which comprises at least one first wire for transmitting AC voltages and at least one second wire for transmitting visible lights; and a control device, which comprises at least one first LED and an AC to DC converter, wherein the AC to DC converter converts a first AC voltage to a first DC voltage for supplying power to the at least one first LED for emitting visible lights to the at least one second wire.

In one embodiment, the control device further comprises a power detector to detect a power according to an AC current when the AC voltage is supplied to an external device to cause the AC current flowing to the external device.

In one embodiment, the control device further comprises an USB interface to connect with an external control device via a USB cable, wherein the external control device is capable of controlling the lighting patterns of the at least one first LED.

In one embodiment, the external control device is a computer.

In one embodiment, the external control device is a mobile device.

In one embodiment, the control device further comprises a wireless interface to connect with an external wireless device for transmitting the detected power to the external wireless device.

In one embodiment, the control device further comprises a microprocessor for controlling the at least one first LED.

In one embodiment, the control device further comprises a microprocessor for controlling the USB interface.

In one embodiment, the control device further comprises a microprocessor for controlling the wireless interface.

In one embodiment, the control device further comprises a first switch, wherein the first LED emits a first visible light when the first switch is on.

In one embodiment, the first LED is a RGB LED.

In one embodiment, the circuitry comprises a first switch, wherein the RGB LED emits a first visible light when the first switch is on.

In one embodiment, the first AC voltage is 110V.

In one embodiment, the first AC voltage is 220V.

In one embodiment, the first AC voltage is 3-phase 380V.

In one embodiment, the second wire is a light bar.

In one embodiment, the control device further comprises an interface such as a USB interface for communicating with an external control device such as a PC, wherein the USB interface can be powered by the AC to DC converter.

In one embodiment, the control device further comprises a wireless module for communicating with an external control device such as a mobile phone, wherein the wireless module can be powered by the AC to DC converter.

In one embodiment, the control device further comprises an overcurrent protection circuit, wherein the overcurrent protection circuit can prevent the AC current from flowing to the external device when the AC current exceeds a threshold.

The detailed technology and above preferred embodiments implemented for the present invention are described in the following paragraphs accompanying the appended drawings for people skilled in the art to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE INVENTION

The detailed explanation of the present invention is described as follows. The described preferred embodiments are presented for purposes of illustrations and descriptions, and they are not intended to limit the scope of the present invention.

The present invention provides an AC power cord assembly, which can include power transmission, power measurement, overcurrent protection, LED and lighting control to change the color of the LED or the lighting patterns of the LED such as flash, breathe, or light up constantly.

The AC power cord assembly includes an AC power cord that can have different types of plugs, such as three-hole power cord (male), three-hole power cord (female), USB standard A or type C plug (male) or any other suitable connectors. The lighting transmission surface of the AC power cord needs at least one surface on the AC power cord for emitting lights. The AC power cord includes at least one wire for transmitting visible lights, and the wire for transmitting visible lights can be a light bar.

In one embodiment, the AC power cord assembly includes a software interface, and users can control the lighting of the light bar through the software interface, wherein the software interface can show online power, lighting mode (flash, breathe, constant) and color. Users can control the lighting and monitor electric power by software.

In one embodiment, the AC power cord assembly includes a wireless communication to control the lighting of the LED.

In one embodiment, the AC power cord assembly includes a pressing button to control the lighting of the LED.

In one embodiment, the lighting patterns or the color of the LED can be adjusted by the control device based on the increase or decrease of the power transmission.

In one embodiment, users can judge the increase or decrease of the power transmission based on the lighting patterns or the color of the LED.

In one embodiment, the AC power cord assembly can include a wireless communication control module for interfacing an external wireless device for controlling the AC power cord assembly.

In one embodiment, the control device further comprises an overcurrent protection circuit, wherein the overcurrent protection circuit can prevent the AC current from flowing to the external device when the AC current exceeds a threshold.

Figure 1A:
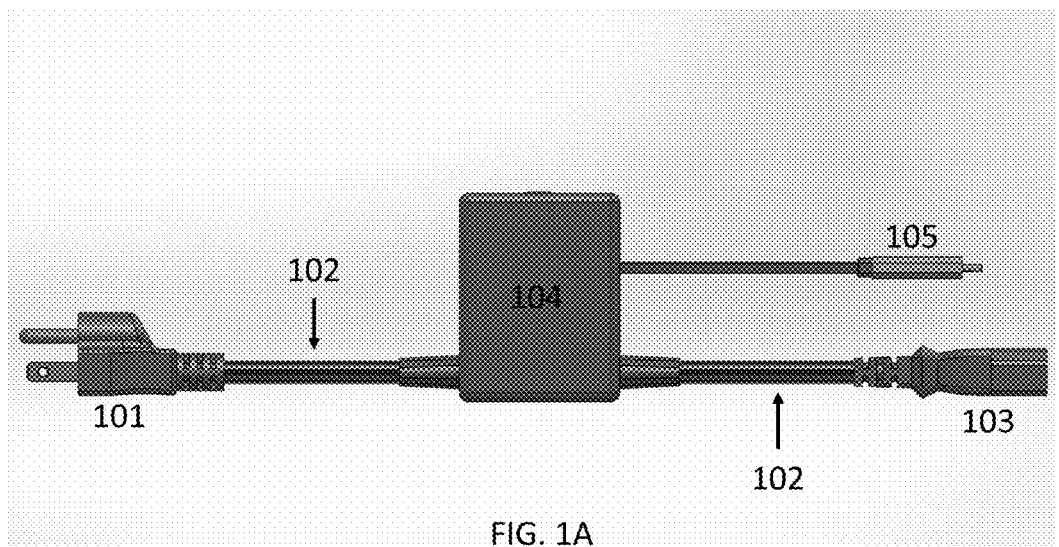
FIG. 1A illustrates a perspective view of an AC power cord assembly according to one embodiment of the present invention.
Figure 1B:
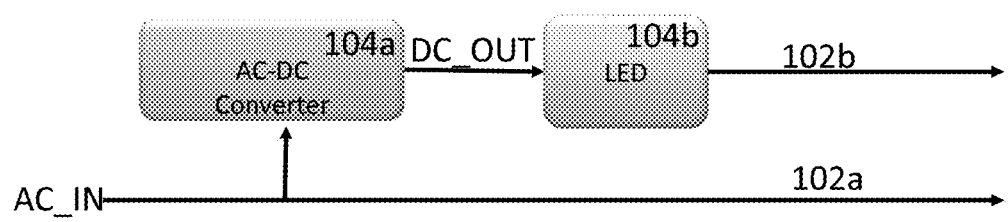
FIG. 1B illustrates a block diagram of the control device in FIG. 1 according to one embodiment of the present invention.
Figure 1C:
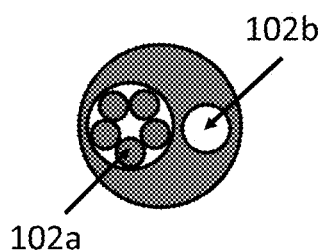
FIG. 1C illustrates an internal view of the cable in FIG. 1 according to one embodiment of the present invention.

Please refer to FIG. 1A, FIG. 1B, and FIG. 1C. FIG. 1A illustrates a perspective view of an AC power cord assembly 100A according to one embodiment of the present invention. As shown in FIG. 1A, the AC power cord assembly 100A comprises a first AC connector 101, a second AC connector 103, a cable 102 connecting the first AC connector 101 and the second AC connector 103, and a control device 104. As shown in FIG. 1C, the cable 102 comprises at least one first wire 102a for transmitting AC voltages and at least one second wire 102b for transmitting visible lights. In one embodiment, the lighting transmission surface of the AC power cord can have at least one surface on the cable 102 for emitting lights.

Please note that the control device 104 can be placed between the first AC connector 101 and the second AC connector 103, or the control device 104 can be integrated with either the first AC connector 101 or the second AC connector 103, so that the portion of the cable 102 between the control device 104 and the first AC connector 101, or the second AC connector 103, can be saved. Please note that the present invention is not limited to the type of the AC plug or the AC socket for connecting to an AC voltage such as 110V, 220V or 3-phase 380V, and etc. Please note that the present invention is not limited to the maximum voltage level of the AC voltage or the number of the phases of the AC voltage.

In one embodiment, the AC power cord assembly 100A further comprises a connector such as a USB interface 105 to connect to an external control device such as a PC or a mobile device, for controlling the power cord assembly 100A. As shown in FIG. 1B, the control device 104 comprises an AC to DC converter 104a and at least one first LED 104b, wherein the AC to DC converter 104a converts a first AC voltage AC_IN to a first DC voltage DC_OUT for supplying the power to the at least one first LED 104b for emitting visible lights to the at least one second wire 102b, and the first AC voltage AC_IN can be transmitted to at least one first wire 102a for providing power to an external device.

Figure 1D:
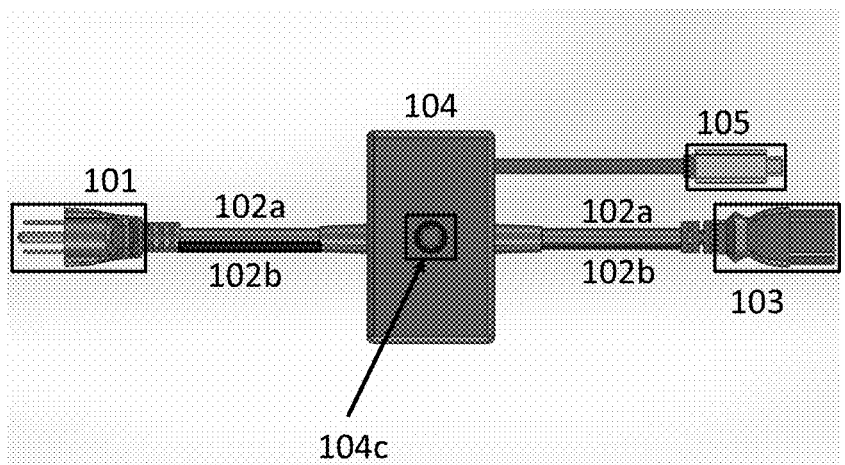
FIG. 1D illustrates a perspective view of an AC power cord assembly according to one embodiment of the present invention.

As shown in FIG. 1D, in the AC power cord assembly 100A, the control device 104 further comprise a first switch 104c, wherein the first LED 104b can emit visible lights when the first switch 104c is on. In one embodiment, the first switch 104c is a pressing button on the control device 104.

Figure 2A:
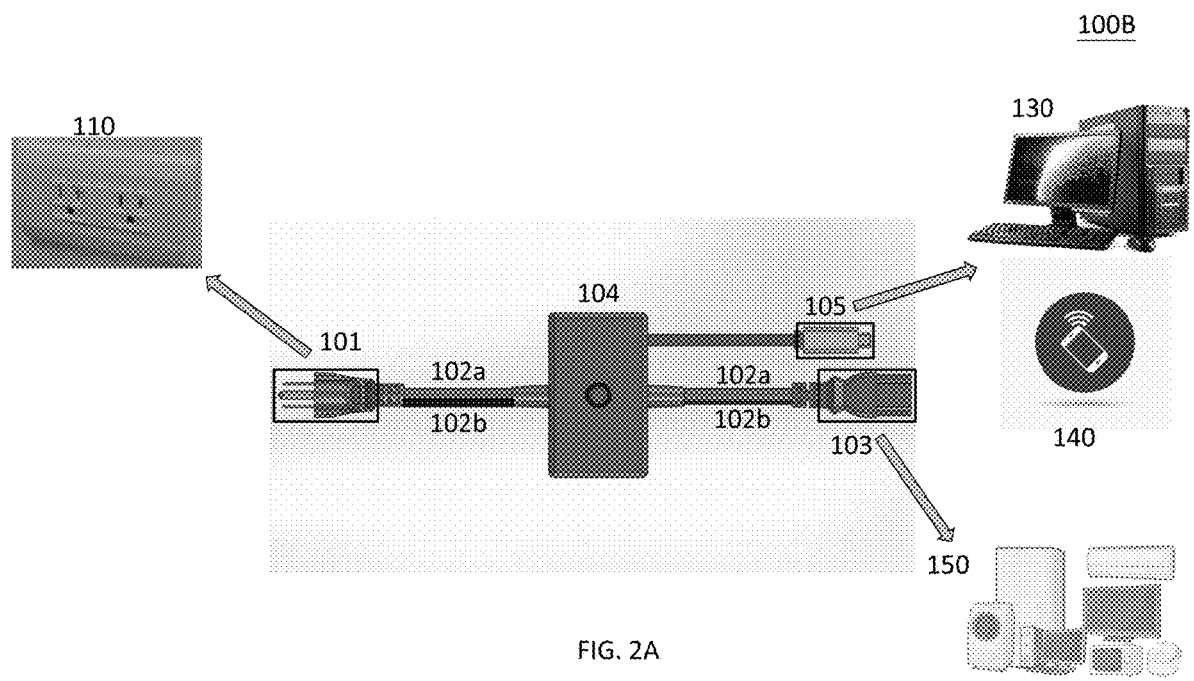
FIG. 2A illustrates many different applications of the AC power cord assembly in FIG. 1 according to one embodiment of the present invention.
Figure 2B:
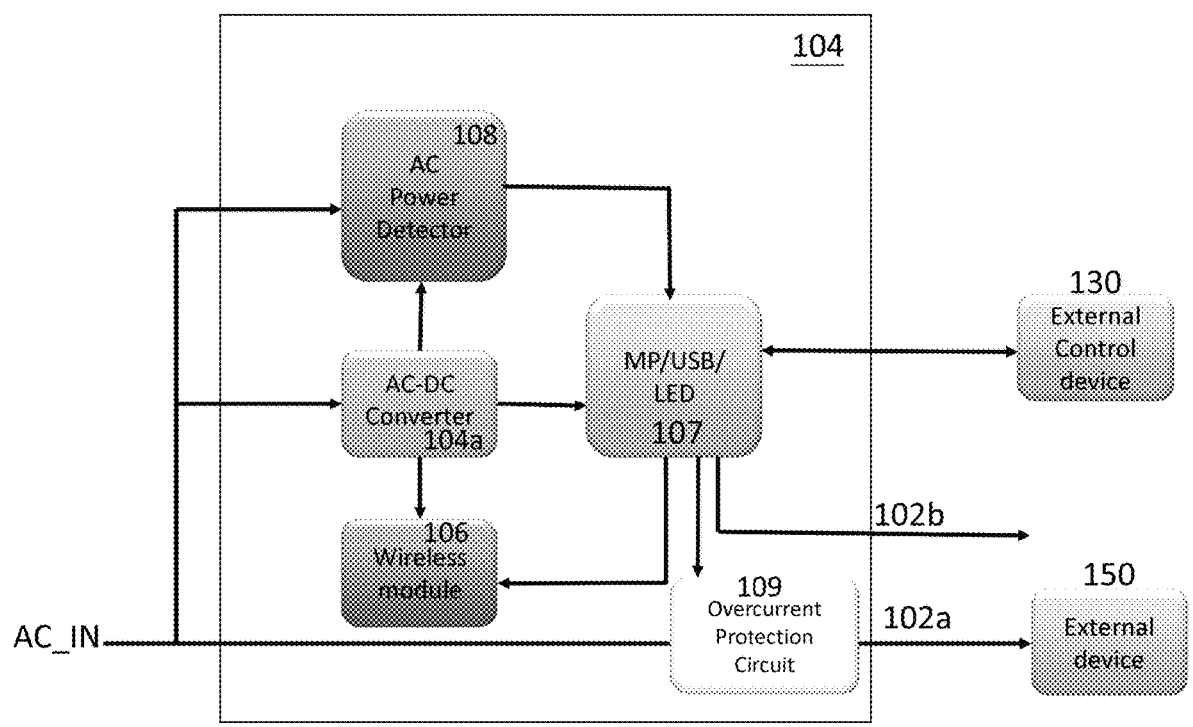
FIG. 2B illustrates a block diagram of the control device in FIG. 1 according to one embodiment of the present invention.

Please refer to FIG. 2A and FIG. 2B. FIG. 2A illustrates a perspective view of the AC power cord assembly in an application environment 100B according to one embodiment of the present invention. As shown in FIG. 2A, in one embodiment, the first AC connector 101 can be a 3-hole male AC plug for plugging into an AC socket 110 on a wall. In one embodiment, the second AC connector 103 can be a 3-hole female AC socket for accepting an AC plug on an external device 150 such as a PC. In one embodiment, the control device 104 comprises a USB interface 105 to connect to an external control device 130 such as a PC for communicating with the control device 104. In one embodiment, the control device 104 comprises a wireless interface to connect to an external wireless device such as a mobile device or a mobile phone 140 for communicating with the control device 104. FIG. 2B illustrates a block diagram of the control device 104.

As shown in FIG. 2B, the control device 104 comprises an AC to DC converter 104a and at least one first LED 104b. The AC to DC converter 104a converts a first AC voltage AC_IN to a first DC voltage DC_OUT for supplying power to an integrated module 107 in which there is a microprocessor and a LED, the microprocessor can control the LED for transmitting visible lights to the at least one second wire 102b. In one embodiment, the integrated module 107 can include an interface for connecting to the external control device 130, and the interface can be any suitable interface such as a USB interface 105. In one embodiment, the control device 104 further comprises a power detector 108 to detect a power according to an AC current when the AC voltage is supplied to the external device 150 to cause the AC current flowing to the external device 150. In one embodiment, the control device 104 further comprises a wireless module 106 that connects a wireless interface of the control device 104 so that the wireless interface of the control device 104 can connect with an external wireless device 140 for transmitting the detected power to the external wireless device 140.

In one embodiment, as shown in FIG. 2B, the control device 104 further comprises overcurrent protection circuit 109, wherein the overcurrent protection circuit 109 can automatically prevent the AC current from flowing to the external device 150 when the AC current exceeds a threshold. In one embodiment, the overcurrent protection circuit 109 can be controlled by the microprocessor to stop the AC current flowing to the external device 150 as needed.

In one embodiment, the microprocessor in the control device 104 can provide a software interface that can allow users to control the lighting of the light bar through the software interface, wherein the software interface can show online power, lighting mode (flash, breathe, constant) and color. In one embodiment, users can control the lighting and monitor the electric power by software as well.

In one embodiment, the external control device is a computer.

In one embodiment, the external control device is a mobile device.

In one embodiment, the control device further comprises a wireless interface to connect with an external wireless device for transmitting the detected power to the external wireless device.

In one embodiment, the control device further comprises a microprocessor for controlling the at least one first LED.

In one embodiment, the control device further comprises a microprocessor for controlling the USB interface.

In one embodiment, the control device further comprises a microprocessor for controlling the wireless interface.

In one embodiment, the control device further comprises a first switch, wherein the first LED emits a first visible light when the first switch is on.

In one embodiment, the first LED is a RGB LED.

In one embodiment, the control device comprises a first switch, wherein the RGB LED emits a first visible light when the first switch is on.

In one embodiment, the first AC voltage is 110V.

In one embodiment, the first AC voltage is 220V.

In one embodiment, the first AC voltage is 3-phase 380V.

In one embodiment, the second wire is a light bar.

In one embodiment, the second wire is a fiber wire.

In one embodiment, the second wire is a plastic fiber wire.

In one embodiment, the RGB LED emits visible light when the switch is on, wherein the RGB LED can emit visible light in different colors. In addition, users can use the switch or with more switches to choose different light modes, which contain different colors, brightness, and lighting patterns. The RGB LED can be controlled such that the RGB LED light is constantly on (with or without AC transmission), or simply turned off.

The above disclosure is related to the detailed technical contents and inventive features thereof. People skilled in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An AC power cord assembly, comprising:
a cable, comprising at least one first wire for transmitting AC voltages and at least one second wire for transmitting visible lights; and
a control device, comprising at least one first LED, wherein the control device comprises an AC to DC converter to convert a first AC voltage to a first DC voltage for supplying power to the at least one first LED for emitting a visible light to the at least one second wire, wherein the control device further comprises a power detector to detect a power according to an AC current when the AC voltage is supplied to an external device to cause the AC current flowing to the external device.

2. The AC power cord assembly as claimed in claim 1, wherein the control device further comprises a wireless interface to connect with an external control device, wherein the external control device is capable of controlling the lighting of the at least one first LED.

3. The AC power cord assembly as claimed in claim 2, wherein the external control device is a mobile device.

4. The AC power cord assembly as claimed in claim 2, wherein the control device further comprises a microprocessor for controlling the wireless interface.

5. The AC power cord assembly as claimed in claim 1, wherein the control device further comprises an USB interface to connect with an external control device, wherein the external control device is capable of controlling the lighting of the at least one first LED.

6. The AC power cord assembly as claimed in claim 5, wherein the control device further comprises a microprocessor for controlling the USB interface.

7. The power cord assembly as claimed in claim 6, wherein the second wire is a light bar.

8. The AC power cord assembly as claimed in claim 1, wherein the control device further comprises an overcurrent protection circuit to prevent the AC current from flowing to the external device when the AC current exceeds a threshold.

9. The power cord assembly as claimed in claim 1, wherein the lighting patterns or the color of the LED are adjusted by the control device based on the increase or decrease of the power detected by the power detector.

10. The AC power cord assembly as claimed in claim 1, wherein the control device further comprises a microprocessor for controlling the at least one first LED.

11. The AC power cord assembly as claimed in claim 1, wherein the control device further comprises a first switch, wherein the first LED emits a first visible light when the first switch is on.

12. The AC power cord assembly as claimed in claim 1, wherein the first LED is a RGB LED.

13. The AC power cord assembly as claimed in claim 12, wherein the control device further comprises a first switch, wherein the RGB LED emits a first visible light when the first switch is on.

14. The power cord assembly as claimed in claim 1, wherein the first AC voltage is 110V, 220V or 3-phase 380V.

* * * * *